United States Patent
Wu et al.

(10) Patent No.: US 8,889,544 B2
(45) Date of Patent: Nov. 18, 2014

(54) DIELECTRIC PROTECTION LAYER AS A CHEMICAL-MECHANICAL POLISHING STOP LAYER

(75) Inventors: Yung-Hsu Wu, Taipei (TW); Hsin-Hsien Lu, Hsinchu (TW); Tien-I Bao, Hsinchu (TW); Shau-Lin Shue, Hsinchu (TW)

(73) Assignee: Taiwan Semiconductor Manufacturing Company, Ltd. (TW)

(*) Notice: Subject to any disclaimer, the term of this patent is extended or adjusted under 35 U.S.C. 154(b) by 94 days.

(21) Appl. No.: 13/028,889

(22) Filed: Feb. 16, 2011

(65) Prior Publication Data
US 2012/0205814 A1     Aug. 16, 2012

(51) Int. Cl.
| | |
|---|---|
| H01L 21/768 | (2006.01) |
| H01L 23/48 | (2006.01) |
| H01L 21/311 | (2006.01) |
| H01L 23/532 | (2006.01) |
| H01L 21/02 | (2006.01) |
| H01L 21/321 | (2006.01) |

(52) U.S. Cl.
CPC ...... *H01L 21/3212* (2013.01); *H01L 21/31144* (2013.01); *H01L 23/53295* (2013.01); *H01L 21/02348* (2013.01); *H01L 21/7684* (2013.01); *H01L 23/5329* (2013.01); *H01L 21/7682* (2013.01); *H01L 21/76825* (2013.01); *H01L 23/53238* (2013.01); *H01L 21/76828* (2013.01); *H01L 21/02203* (2013.01); *H01L 21/76829* (2013.01); *H01L 2221/1047* (2013.01)
USPC ............ 438/637; 257/774; 438/645; 438/653

(58) Field of Classification Search
CPC ................. H01L 21/02203; H01L 21/02348; H01L 21/31144; H01L 21/3212; H01L 23/53238; H01L 23/5329; H01L 23/53295; H01L 21/76829; H01L 23/53228

USPC ......... 438/612, 614, 618, 622–624, 633, 653, 438/687, 691–692, 700, 960, 637, 645; 257/734, 773–774, E23.004, E21.579, 257/E23.011, E21.584
See application file for complete search history.

(56) References Cited

U.S. PATENT DOCUMENTS

| | | |
|---|---|---|
| 5,674,784 A | 10/1997 | Jang et al. |
| 6,159,786 A | 12/2000 | Chiang et al. |

(Continued)

OTHER PUBLICATIONS

E. Todd Ryan, Stephen M. Gates et al., "Property modifications of nanoporous pSiCOH dielectrics to enhance resistance to plasma-induced damage", Nov. 2008, Journal of Applied Physics 104, Full Article.*

(Continued)

*Primary Examiner* — Khiem D Nguyen
*Assistant Examiner* — Pauline Vu
(74) *Attorney, Agent, or Firm* — Lowe Hauptman & Ham, LLP

(57) ABSTRACT

The disclosure provides mechanisms of performing metal chemical-mechanical polishing (CMP) without significant loss of copper and a dielectric film of damascene structures. The mechanisms use a metal CMP stop layer made of a low-k dielectric film with a porogen, which significantly reduces the removal rate of the metal CMP stop layer by metal CMP. The metal CMP stop layer is converted into a porous low-k dielectric film after a cure (or curing) to remove or convert the porogen. The low-k value, such as equal to or less than about 2.6, of the metal CMP stop layer makes the impact of using of the metal CMP stop layer on RC delay from minimum to none. Further the CMP stop layer protects the porous low-k dielectric film underneath from exposure to water, organic compounds, and mobile ions in the CMP slurry.

20 Claims, 9 Drawing Sheets

(56) References Cited

U.S. PATENT DOCUMENTS

| | | | |
|---|---|---|---|
| 6,255,211 B1 | 7/2001 | Olsen et al. | |
| 6,358,832 B1 | 3/2002 | Edelstein et al. | |
| 6,368,955 B1 * | 4/2002 | Easter et al. | 438/633 |
| 6,528,409 B1 * | 3/2003 | Lopatin et al. | 438/618 |
| 6,583,048 B1 | 6/2003 | Vincent et al. | |
| 6,592,764 B1 | 7/2003 | Stucky et al. | |
| 6,710,450 B2 * | 3/2004 | Gates et al. | 257/759 |
| 6,783,862 B2 * | 8/2004 | Hedrick et al. | 428/447 |
| 6,787,453 B2 * | 9/2004 | Abell | 438/637 |
| 6,846,515 B2 | 1/2005 | Vrtis et al. | |
| 6,878,615 B2 * | 4/2005 | Tsai et al. | 438/618 |
| 7,023,093 B2 * | 4/2006 | Canaperi et al. | 257/760 |
| 7,057,287 B2 * | 6/2006 | Kumar et al. | 257/758 |
| 7,071,539 B2 * | 7/2006 | Nicholson et al. | 257/642 |
| 7,094,713 B1 * | 8/2006 | Niu et al. | 438/795 |
| 7,115,995 B2 * | 10/2006 | Wong | 257/759 |
| 7,125,793 B2 * | 10/2006 | Liou et al. | 438/637 |
| 7,176,245 B2 | 2/2007 | Stucky et al. | |
| 7,217,648 B2 * | 5/2007 | Lu et al. | 438/618 |
| 7,265,061 B1 * | 9/2007 | Cho et al. | 438/764 |
| 7,482,265 B2 * | 1/2009 | Chen et al. | 438/637 |
| 7,602,038 B2 * | 10/2009 | Zhu | 257/522 |
| 7,626,245 B2 | 12/2009 | Tsai et al. | |
| 2002/0198353 A1 * | 12/2002 | Chen et al. | 528/10 |
| 2004/0084774 A1 * | 5/2004 | Li et al. | 257/758 |
| 2004/0102032 A1 * | 5/2004 | Kloster et al. | 438/623 |
| 2004/0130027 A1 * | 7/2004 | Chen et al. | 257/758 |
| 2004/0130032 A1 * | 7/2004 | Gronbeck et al. | 257/759 |
| 2005/0020702 A1 * | 1/2005 | Li et al. | 521/52 |
| 2005/0064726 A1 * | 3/2005 | Reid et al. | 438/778 |
| 2005/0133923 A1 * | 6/2005 | Yoshie | 257/758 |
| 2005/0178741 A1 * | 8/2005 | Yeoh | 216/67 |
| 2006/0128167 A1 * | 6/2006 | Nakata et al. | 438/795 |
| 2006/0141641 A1 * | 6/2006 | Fan et al. | 438/4 |
| 2007/0200235 A1 * | 8/2007 | Ohkura | 257/734 |
| 2007/0296064 A1 * | 12/2007 | Gates et al. | 257/632 |
| 2008/0171431 A1 * | 7/2008 | Yu et al. | 438/618 |
| 2008/0182403 A1 * | 7/2008 | Noori et al. | 438/618 |
| 2008/0188074 A1 * | 8/2008 | Chen et al. | 438/623 |
| 2009/0054674 A1 * | 2/2009 | Lukas et al. | 556/450 |
| 2009/0286394 A1 * | 11/2009 | Ko et al. | 438/666 |
| 2010/0052115 A1 * | 3/2010 | McAndrew et al. | 257/632 |
| 2010/0102452 A1 * | 4/2010 | Nakao | 257/773 |
| 2010/0227471 A1 * | 9/2010 | Leung et al. | 438/637 |
| 2010/0327456 A1 * | 12/2010 | Chen et al. | 257/773 |

OTHER PUBLICATIONS

Sanjeev Jain, Vladimir Zubkov et al., "Porous low-k dielectrics using ultraviolet curing", Sep. 2005, Solid State Technology, vol. 48, issue 9, Full Article.*

Kastenmeier, Bernd; Klaus Pfeifer,; Andreas Knorr,. "Porous low-k materials and effective k.(Research & Development)." Jul. 2004. Semiconductor International. Reed Business Information, Inc. (US). Full Article.*

E. Todd Ryan et al., "Property modifications of nanoporous pSiCOH dielectrics to enhance resistance to plasma-induced damage", Nov. 2008, Journal of Applied Physics 104.*

U.S. Appl. No. 12/893,374, filed Sep. 29, 2010.

* cited by examiner

… (US 8,889,544 B2)

DIELECTRIC PROTECTION LAYER AS A CHEMICAL-MECHANICAL POLISHING STOP LAYER

BACKGROUND

The present disclosure relates to a method of fabricating a multi-level metal interconnect for a semiconductor device. Particularly, the disclosure relates to a method of fabricating a damascene metal interconnect.

When an integrated circuit (IC) has gradually increased the number of features that are integrated within it, with a corresponding reduction of a width of metal line, a conventional aluminum interconnect increases its resistance as a result. At the same time, a denser distribution of electrical current usually leads to a more serious electro-migration. As the resistance of the metal interconnects increases, the device suffers from an increase in RC time delay and an increase in capacitance between the metal interconnects. Therefore, the operation speed of the device is reduced. The electro-migration causes a short circuit in the aluminum interconnects. Therefore, copper, which has a lower resistance and exhibits a lower electro-migration, has become a suitable choice for all semiconductor manufacturers. In addition, the copper interconnect can approximately double the operation speed of the device when compared with the aluminum interconnect.

Since copper itself is not easily etched by a conventional etching gas, the fabrication of the copper interconnect cannot be accomplished by the conventional etching method, but is achieved using a damascene technique. The damascene technique involves forming an opening for a metal interconnect, such as a damascene opening in a dielectric layer, followed by filling the damascene opening with metal layers. The metal layers outside the damascene opening are removed by chemical-mechanical polishing (CMP). However, the conventional fabrication method of a copper damascene has technical challenges to overcome.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following description provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1A:
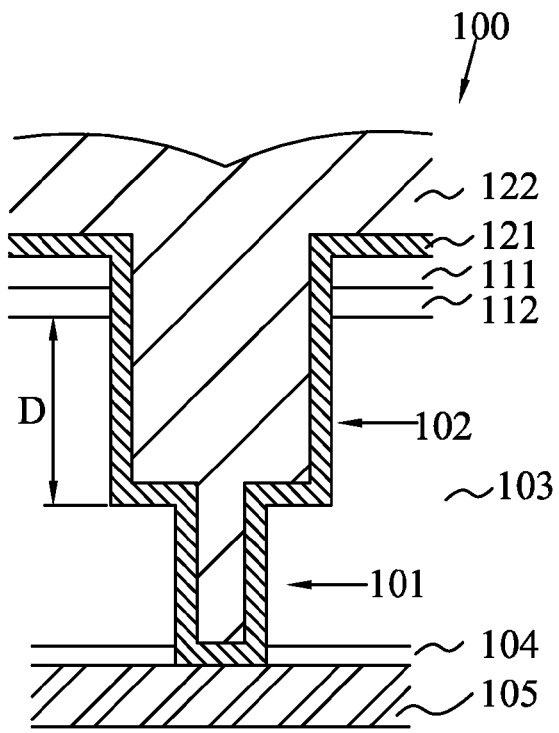
FIG. 1A shows a cross-sectional view of a copper damascene structure, in accordance with some embodiments.

FIG. 1A shows a cross-sectional view of a copper damascene structure 100, in accordance with some embodiments. The copper damascene structure includes a via 101 and a metal structure 102, which are formed by etching through a dielectric layer 103. The metal structure has a height "D." In some other embodiments, the dielectric layer 103 could be more than one layer and could be made of one type of material. The via 101 opening etches through an etch stop layer 104 and comes in contact with an underlying conductive layer 105, which could be M1, M2, or other metal layers. Alternatively, the underlying conductive layer 105 could a gate, such as a doped polysilicon gate, or a doped diffusion region, if the via 101 is a contact hole. In some embodiment, the etch stop layer 104 is made of SiC with a thickness in a range from about 200 Å to about 500 Å.

In some embodiments, the dielectric layer 103 includes a low dielectric constant (low-k) dielectric material. Suitable materials for the low-k dielectric material may include, but are not limited to, doped silicon dioxide, fluorinated silica glass (FSG), carbon-doped silicon dioxide, porous silicon dioxide, porous carbon-doped silicon dioxide, SiLK™ (an organic polymeric dielectric distributed by Dow Chemical of Michigan), Black Diamond (a product of Applied Materials of Santa Clara, Calif.), Xerogel, Aerogel, amorphous fluorinated carbon, Parylene, bis-benxocyclocutenes (BCB), polyimide, polynoroboneses, benzocyclocutene, PTFE, porous SiLK, hydrogen silsesquioxane (HSQ), methylsilsesquioxane (MSQ), and/or combinations thereof. The low-k dielectric material may be deposited by a chemical vapor deposition (CVD), plasma enhanced CVD (PECVD), or spin-on process.

The low-k dielectric could be an extreme low-k dielectric (ELK). The ELK material may have a dielectric constant of less than about 2.5. Exemplary ELK materials include porous low-k materials. In some embodiments, the ELK is a silicon oxide based low-k material having a porous structure, which is adapted to a porogen-doped SiCO-based material by incorporating a porogen (or a porogen material) into a carbon-doped oxide dielectric. In some embodiments, the low-k dielectric is an organosilica glass. The porogen may be any suitable pore generating material, such as a hydrocarbon. In an embodiment, the porogen has the structure CxHy. The low-k dielectric and/or the porogen precursor may be substantially similar to embodiments described in U.S. Pat. No. 6,846,515 and U.S. Pat. No. 6,583,048, hereby incorporated by reference. In some embodiments, the porogen is alpha-terpinene (ATP) and 2,5-norbornadiene (NBDE).

In addition, the low-k dielectric may include one or more additives. The additive may be used to increase the carbon content of the final low-k dielectric material from that which it would have had if including only the low-k dielectric and/or the porogen. The additive may also increase the mechanical strength or hardness of the final low-k dielectric material from that which it would have had if including only the low-k dielectric and/or the porogen. Details of forming an exemplary low-k material may be found in U.S. patent application Ser. No. 12/893,374, titled "Low Dielectric Constant Material," and filed on Sep. 29, 2010. The above mentioned patent application is hereby incorporated by reference in its entirety.

After a low-k dielectric film containing the porogen is deposited on the substrate, the film may need to be cured to create pores in the low-k dielectric film and to remove the porogen or to convert the porogen into part of the low-k dielectric, in accordance with some embodiments. The low-k dielectric film containing the porogen before the porogen is converted is dense and without pores. In some embodiments, the dense low-k dielectric film undergoes a heating process to convert the porogen. The curing could be performed in a furnace or by other processes, such as ultra-violet (UV) curing, rapid thermal curing, flash curing, laser curing, etc. UV curing is an effective way of converting the porogen into part of the low-k dielectric. The curing may be performed in an environment with hydrogen, such as pure hydrogen or hydrogen with an inert gas, to prevent the oxidation of metal layer(s) exposed or covered by the low-k dielectric layer. For example, the curing may be a UV curing, performed at a temperature in a range from about 300° C. to about 400° C. The curing time depends on the thickness of the dense low-k dielectric layer. For example, a dense low-k dielectric film with a thickness in a range from about 500 Å to about 3500 Å may be cured for a period in a range from about 1 minute to about 30 minutes. Additional information regarding UV curing for creating a porous low-k dielectric film may be found in U.S. Pat. No. 7,626,245, filed on Jan. 2, 2008, and entitled "Extreme Low-K Dielectric Film Scheme for Advanced Interconnect," which is hereby incorporated by reference in its entirety.

To pattern the damascene structure with via 101 and metal structure 102, multiple layers have been used, in accordance with some embodiments. FIG. 1A shows that a hard mask layer 111, and an anti-reflective layer 112 are used. The hard mask layer 111 made be made of a dielectric material or a metallic material. In some embodiment, the hard mask layer 111 is made of TiN with a thickness in a range from about 100 Å to about 500 Å. The hard mask layer 111 could be patterned and etched by a photoresist layer (not shown) and is used to reduce loss of etch mask. The anti-reflective layer (ARL), or anti-reflective coating (ARC) 112 is applied on the substrate to reduce reflection during exposure, which could improve contrast and exposure efficiency. In some embodiments, the ARL is a nitrogen-free ARL (NFARL), which may be made of material such as SiO, or $SiO_yC_z$, with a thickness in a range from about 100 Å to about 500 Å. In some embodiments, underneath the anti-reflective layer 112, there is a buffer layer (not shown), which may act as a stress buffer between the dielectric layer 103 and the dual anti-reflective layer 112 with hard mask layer 111. In some embodiments, this buffer layer is made of $SiC_aN_b$, with a thickness in a range from about 50 Å to about 500 Å.

After the anti-reflective layer 112 and the hard mask layer 111 are deposited on the dielectric layer 103, a photoresist layer (not shown) is deposited and patterned on the substrate. The patterned photoresist layer is used as a mask to etch the hard mask layer 111. The hard mask layer 111 is then used as a mask to etch the anti-reflective layer 112 and the opening of metal structure 102, in accordance with some embodiments. The etching of opening of via 101 could use similar schemes described above for etching the opening of metal structure 102, in accordance with some embodiments. To pattern openings of a damascene structure shown in FIG. 1A, at least two lithographical processes and two etching processes are needed.

After the openings 101 and 102 are formed, a copper barrier layer 121 is deposited. The copper barrier layer 121 may also act as an adhesion promotion layer. In some embodiments, the copper barrier layer 121 is made from Ta, Ti, TaN, TiN, or a composite film with two of the above mentioned materials. For example, the copper barrier layer 121 may be made of a composite of Ta and TaN (or Ta/TaN), with a thickness in a range from about 5 Å to about 800 Å. After the copper barrier layer 121 is deposited, a copper layer 122 is plated on the substrate to fill the openings of via 101 and metal structure 102. Before copper layer 122 is plated on the substrate, a copper seed layer is often deposited on the copper barrier layer 121.

Figure 1B:
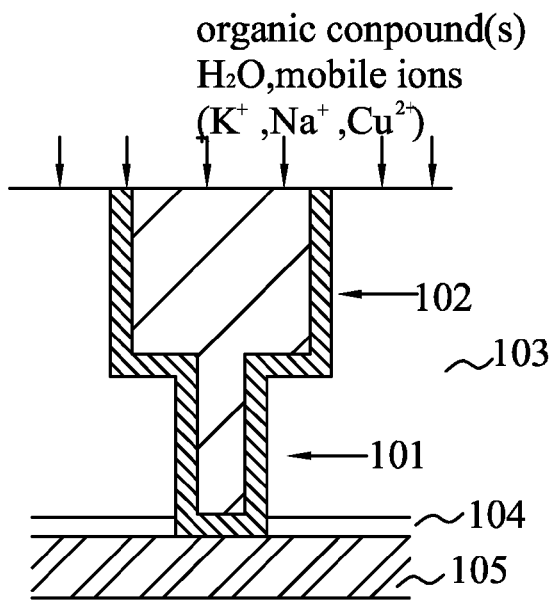
FIG. 1B shows a cross-sectional view of the copper damascene structure after a copper CMP process, in accordance with some embodiments.

After the copper layer 122 is plated on the substrate 105, the copper layer 122 outside the openings of via 101 and metal structure 102 is removed by chemical-mechanical polishing (CMP). After CMP, the copper barrier layer 121 is also removed. Due to CMP non-uniformity, the hard mask layer 111 and ARL layer 112 are removed with the dielectric layer 103 exposed, as shown in FIG. 1B in accordance with some embodiments. For an advanced processing technology, the dielectric layer 103 may be made of a porous low-k dielectric material, such as the ones described above. Organic compounds(s), water ($H_2O$), and mobile ions, such as $K^+$, $Na^+$, $Cu^{2+}$, etc. in the CMP slurry come in contact with exposed dielectric layer 103, which is made of porous low-k material, in accordance with some embodiments. The organic compounds, water and mobile ions can easily penetrate the porous dielectric film to affect the property of the dielectric layer 103 and can even penetrate to the gate dielectric to cause time dependent dielectric break down (TDDB) of the gate dielectric after the gate devices are used for a period of time.

Figure 1C:
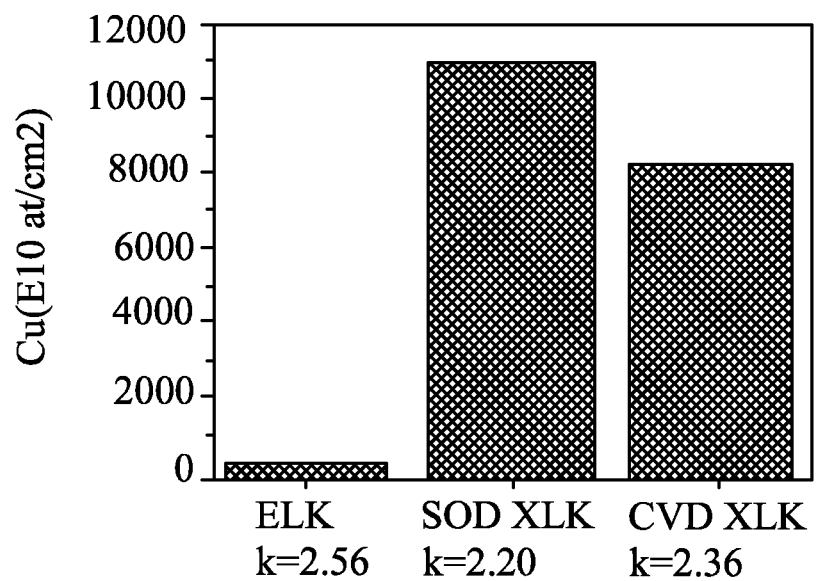
FIG. 1C shows comparison of copper ion diffusion in low-k films after metal CMP, in accordance with some embodiments.

FIG. 1C shows a comparison of amount of copper ions diffused into three low-K films after metal (copper and barrier layer) CMP, in accordance with some embodiments. They include a CVD XLK with a k value of about 2.36, a SOD (spin-on-dielectric) XLK with a k value about 2.20, and an ELK with a k value of about 2.55. All three films are porous films. The results show that there are significant amounts of Cu ions diffused (and/or are left) into the low-k dielectric films, especially on the porous XLK films.

Further, the CMP rate of the porous low-k dielectric film has a high polish rate and could result in significant loss of the dielectric and copper (inside the damascene), which could increase the resistivity of interconnect. In addition, the water ($H_2O$) in the dielectric layer 103 needs to be driven out by heating, which could be time-consuming especially when $H_2O$ penetrates deeply into the dielectric layer 103.

Figure 1D:
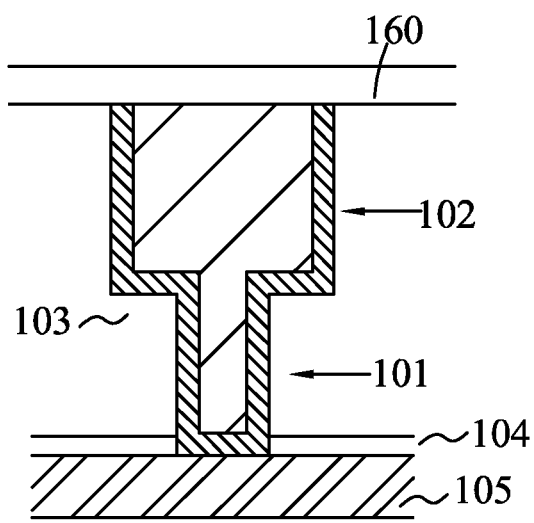
FIG. 1D shows the damascene opening of FIG. 1B with a dielectric capping layer deposited over the dielectric layer and covering the exposed copper, in accordance with some embodiments.

FIG. 1D shows that a dielectric capping layer 160 is deposited over the dielectric layer 103 and covers the exposed copper in the damascene opening, in accordance with some embodiments. The dielectric capping layer 160 is deposited after the dielectric layer 103 is dried (removed of $H_2O$ in the layer) by a preheat process and/or a pre-treatment process. The preheat process can be performed at a temperature in a range from about 100° C. to about 400° C. for a period in a range from about one second to about 30 minutes. The pre-treatment process can be performed by a plasma with one or more gases, such as $H_2$, $NH_3$, $N_2$, at a temperature in a range from about 100° C. to about 400° C. for a period in a range from about one second to about 30 minutes. The dielectric capping layer 160 may be used as an etch stop layer for the upper interconnect in a manner similar to etch stop layer 104 described above.

Figure 2A:
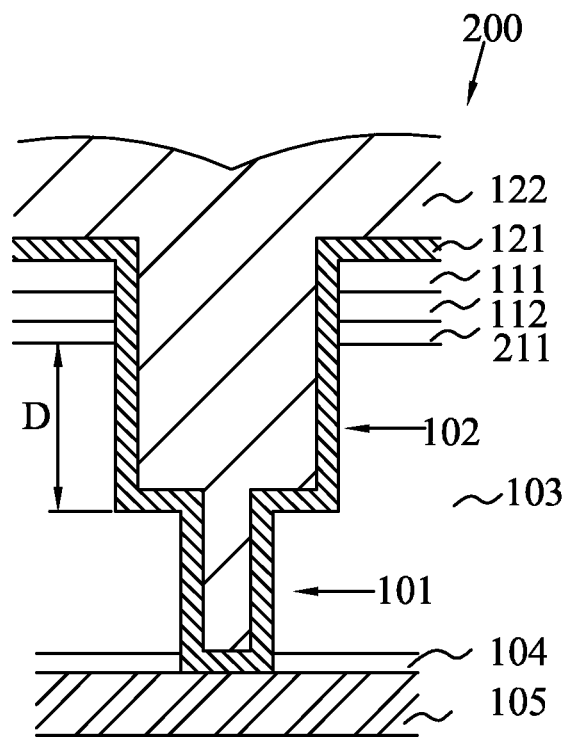
FIG. 2A shows a damascene structure similar to FIG. 1A with a CMP stop layer, in accordance with some embodiments.
Figure 2B:
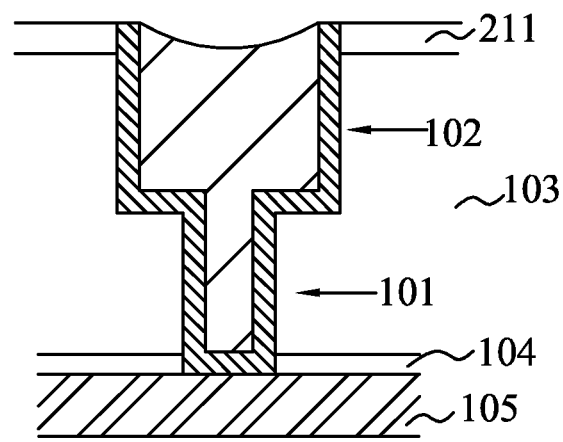
FIG. 2B shows a cross-sectional view of the damascene structure of FIG. 2A after metal CMP, in accordance with some embodiments.
Figure 2C:
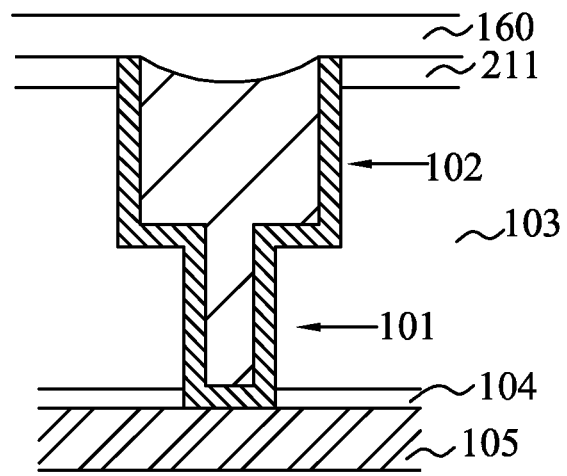
FIG. 2C shows the damascene opening of FIG. 2B with a dielectric capping layer deposited over the dielectric layer and covering the exposed copper, in accordance with some embodiments.

To address the issue of significant dielectric and copper loss of the damascene structure, a CMP stop layer can be used. FIG. 2A shows a damascene structure 200 similar to the one in FIG. 1A with the exception of having a CMP stop layer 211, in accordance with some embodiments. The CMP stop layer 211 may be made of a common CMP stop material, such as SiN or SiC. FIG. 2B shows a cross-sectional view of the damascene structure of FIG. 2A after metal CMP, in accordance with some embodiments. The CMP stop layer 211 can stop the metal CMP, especially barrier layer CMP, from removing dielectric layer 103 underneath. Without exposing the dielectric layer 103, water and mobile ions cannot come in contact with the dielectric layer 103, which resolve the concerns of TDDB and trapped wafer in the dielectric layer 103. As a result, only a brief drying is required, before the capping layer 160 is deposited to cover the surface of the substrate, as shown in FIG. 2C in accordance with some embodiments. However, the dielectric constant of such a CMP stop layer, such as SiN or SiC, is fairly high, e.g., higher than 6. The high dielectric constant would greatly increase the capacitance of the dielectric layer 103 and significantly increase RC (resistive-capacitive) delay. Therefore, it is desirable to find a CMP stop layer that has low dielectric constant (or k value).

Figure 3A:
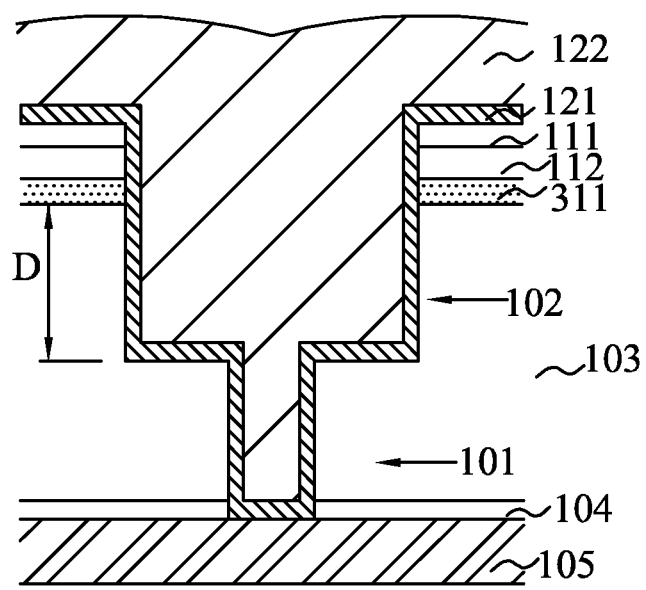
FIG. 3A shows a damascene structure similar to the one in FIG. 2A, in accordance with some embodiments.
Figure 3B:
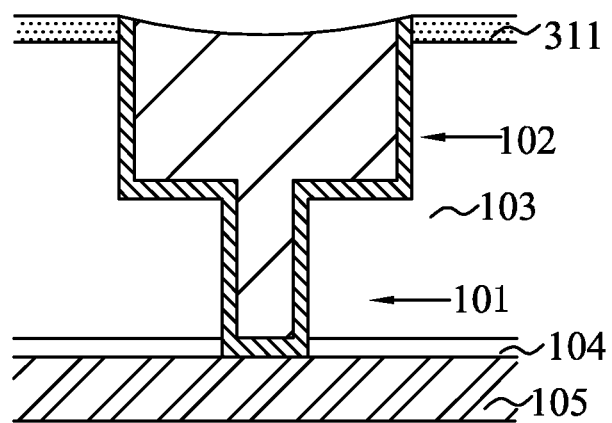
FIG. 3B shows a cross-sectional view of the damascene structure of FIG. 3A after metal CMP, in accordance with some embodiments.
Figure 3C:
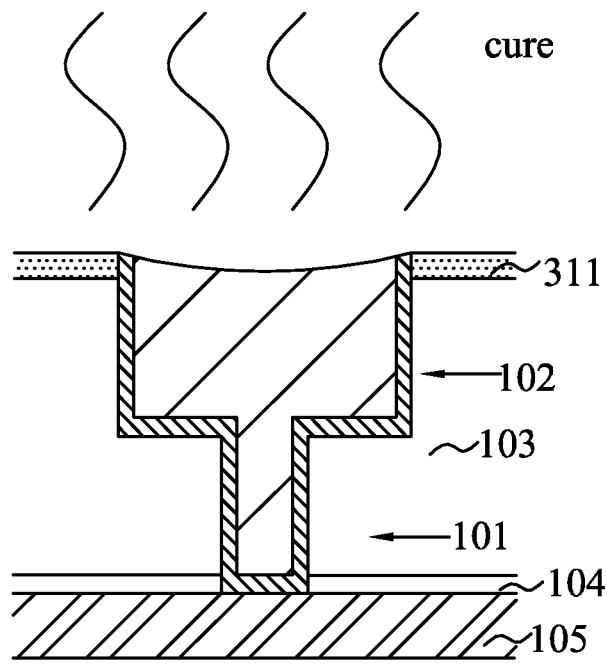
FIG. 3C shows that the CMP stop layer is cured to drive out or convert the porogen, in accordance with some embodiments.

FIG. 3A shows a damascene structure 300 similar to the one in FIG. 2A, in accordance with some embodiments. The CMP stop layer is labeled as 311 and is made of a dense low-k dielectric material similar to the material used for forming dielectric layer 103. In some embodiments, the CMP stop layer is deposited by chemical vapor deposition (CVD). However, the film may also be deposited by other methods. The dense low-k dielectric material has a porogen, which is described above, and has not been cured. The thickness of the CMP stop layer 311 is in a range from about 100 Å to about 600 Å, in accordance with some embodiments. Due to the existence of the porogen, the CMP rate of the CMP stop layer 311 is much lower than the cured porous low-k dielectric layer 103. In some embodiments, the porogen is alpha-terpinene (ATP) or 2,5-norbornadiene (NBDE). Since as-deposited CMP stop layer 311 has not been cured yet, the $C_xH_y$ compounds of the porogen are hard to remove by the CMP slurry. FIG. 3B shows a cross-sectional view of the damascene structure of FIG. 3A after metal CMP, in accordance with some embodiments. The CMP stop layer 311 can stop the metal CMP from removing dielectric layer 103 underneath, in a manner similar to the CMP stop layer 211. Without exposing the dielectric layer 103, water and mobile ions cannot come in contact with the dielectric layer 103, which resolves the concerns of TDDB and trapped wafer in the dielectric layer 103. The curing of the CMP stop layer, which is made of a dense low-k dielectric material (without pores before curing), is performed after CMP. FIG. 3C shows that the CMP stop layer 311 is cured to drive out or convert the porogen, in accordance with some embodiments.

As mentioned above, the cure (curing, heating, baking, or treatment), may be performed in a furnace or by other processes, such as ultra-violet (UV) curing, rapid thermal curing, flash curing, laser curing, etc. The curing also may be performed in an environment with hydrogen, such as pure hydrogen or hydrogen with an inert gas, to prevent the oxidation of metal layer(s) exposed or covered by the porous low-k dielectric layer. For example, the curing may be an UV curing, performed at a temperature in a range from about 300° C. to about 400° C. The UV rays assist in breaking the bonds of the porogen, which results in small molecules being released from the low-k film. Since the curing time depends on the thickness of the dense low-k dielectric layer, the thin CMP stop layer 311 only needs to be cured for a relatively short period. In some embodiments, the curing time is in a range from about 1 second to about 20 minutes. In other embodiments, the UV curing time is in a range from about 10 seconds to about 30 minutes.

Figure 3D:
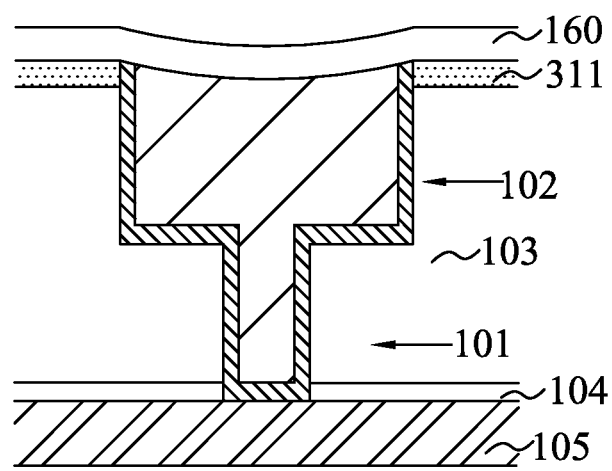
FIG. 3D shows that a dielectric capping layer is deposited over the structure of FIG. 3C, in accordance with some embodiments.

After the CMP stop layer is cured, a dielectric capping layer 160 is deposited over the structure, as shown in FIG. 3D in accordance with some embodiments. The CMP stop layer 311 becomes the same material as the dielectric layer 103 after cure and has a k value similar to the dielectric layer 103. The dielectric layer 103 is a porous low-k material and has a k value less than about 2.6. Because the CMP stop layer 311 is made of the same material as the dielectric layer, the k value of the CMP stop layer after UV-curing is about the same as the dielectric layer 103. Using such a CMP stop layer 311, the k value of the CMP stop layer 311 stays low. In addition, the CMP stop layer 311 prevents significant loss of dielectric layer 103 and copper loss in the damascene structure. As a result, the resistivity (R) and the RC delay of the damascene structure are kept low.

Figure 4A:
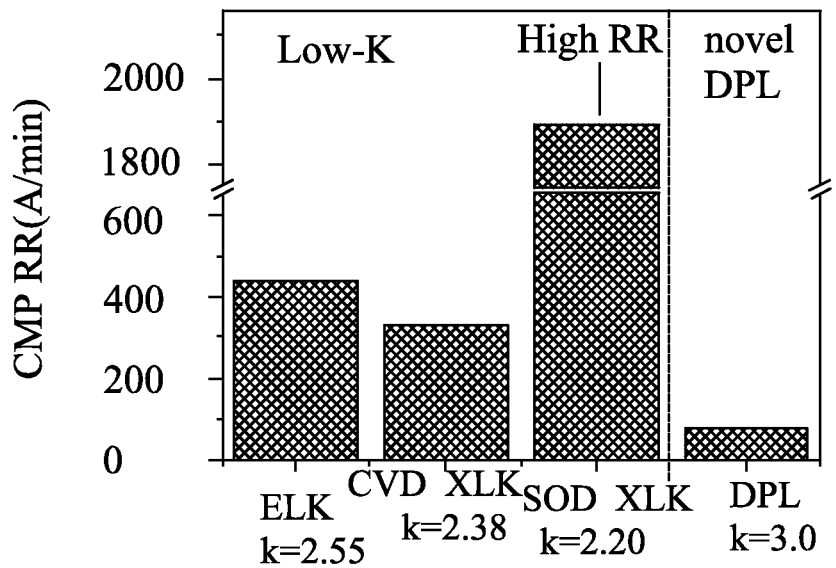
FIG. 4A shows a diagram comparing removal rate (RR) of different low-k materials by metal CMP, in accordance with some embodiments.

FIG. 4A shows a diagram comparing removal rate (RR) of different low k materials by metal CMP, in accordance with some embodiments. The CMP removal rates of 4 low-k materials are compared. The materials include a porous ELK material (after cure) with a k value of about 2.55, a CVD ultra low-k (XLK) material with a k value of about 2.36, a spin-on-dielectric (SOD) XLK material with a k value of about 2.20, and a dielectric protection layer (DPL), which is the CMP stop layer 311 described above and is a dense ELK material similar to the first material (ELK) before cure, which has a k value about 3.0. The CVD XLK mentioned above is made of diethoxymethylsilane (DEMS) and one or more hardening additives, such as an ethane-bridged oxycargbosi-lane. Details of the material may be found in U.S. patent application Ser. No. 12/893,374, entitled "Low Dielectric Constant Material" and filed on Sep. 29, 2010, which is incorporated herein in its entirety. The SOD XLK mentioned above is a Si—O—C hybrid polymer, which is based on organosilsesquioxanes using triblock copolymer as a structure-directing agent. Details of the material may be found in U.S. Pat. No. 6,592,764, entitled "Block Copolymer Processing for Mesostructured Inorganic Oxide Materials" and filed on Dec. 11, 2000, which is hereby incorporated by reference in its entirety.

The data shows that the DPL (or dense low-k CMP stop layer) has a CMP removal rate at about 50-60 Å/min, which is about ½ the removal rate of the porous ELK (k~2.55) material. The data show that the removal rate of the CVD XLK (k~2.36), although lower than ELK, is still too high. The data also show that the removal rate of SOD XLK (k~2.20) is extremely high at close to 1900 Å/min. The data in FIG. 4A are collected from CMP performed on blank wafers. CMP data collected from patterned wafers (with copper damascene structures) show a much reduced dielectric thickness uniformity (2.9% with CMP-stop vs. 4.6% without CMP-stop) with the usage of the low-k CMP stop layer. The center to edge difference in thickness is also improved (37 Å with CMP-stop vs. 80 Å without CMP-stop) with the usage of the low-k CMP stop layer.

Figure 4B:
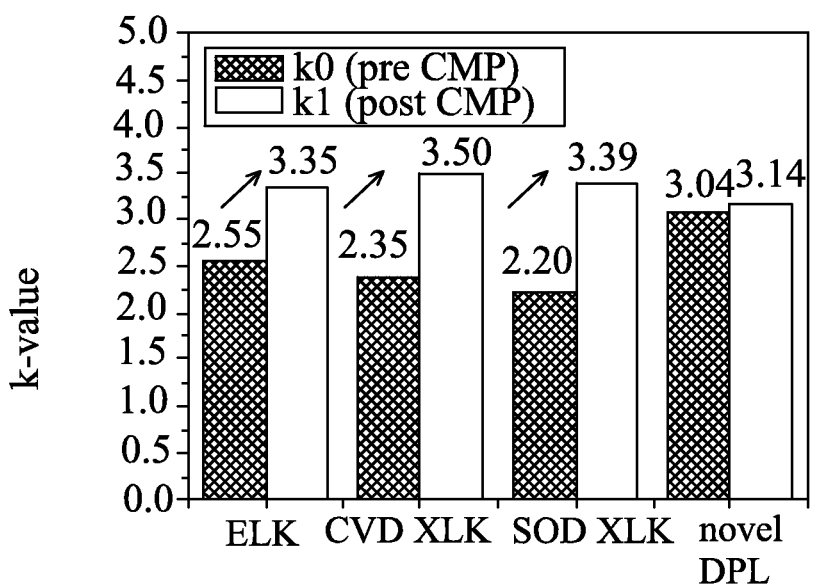
FIG. 4B shows a graph comparing k values before and after CMP, in accordance with some embodiments.

With the CMP stop layer having been exposed to the CMP slurry, one concern is if the property of the low-K CMP stop layer has been modified. FIG. 4B shows a graph comparing k values before and after CMP, in accordance with some embodiments. The data show that the DPL film (uncured dense ELK film for CMP stop layer) shows the least change in the k value. Although the k values of all films after CMP have increased due to exposure to water, mobile ions and other elements in the CMP slurry, the k values normally can return to pre-CMP values after a bake (to drive out moisture). The least increase in k value for the DPL film (uncured dense low-k film for CMP stop layer) indicates that the film is more stable in the presence of the metal CMP slurry in comparison to the other 3 films.

Due to the usage of the CMP stop layer, such as layer 311 of FIG. 3A, the losses of copper in the damascene structure and the surrounding dielectric material are also reduced. Rs (resistivity) data of spice structures shows a 4% non-uniformity for using a CMP stop layer in comparison to a 11% non-uniformity for not using a CMP stop layer. In addition, the Rs data for comb-meander (or comb-serpentine) structure shows 4% non-uniformity for using a CMP stop layer in comparison to 17% non-uniformity for not using a CMP stop layer. Both sets of data show a uniformity improvement in Rs by using a CMP stop layer.

Figure 4C:
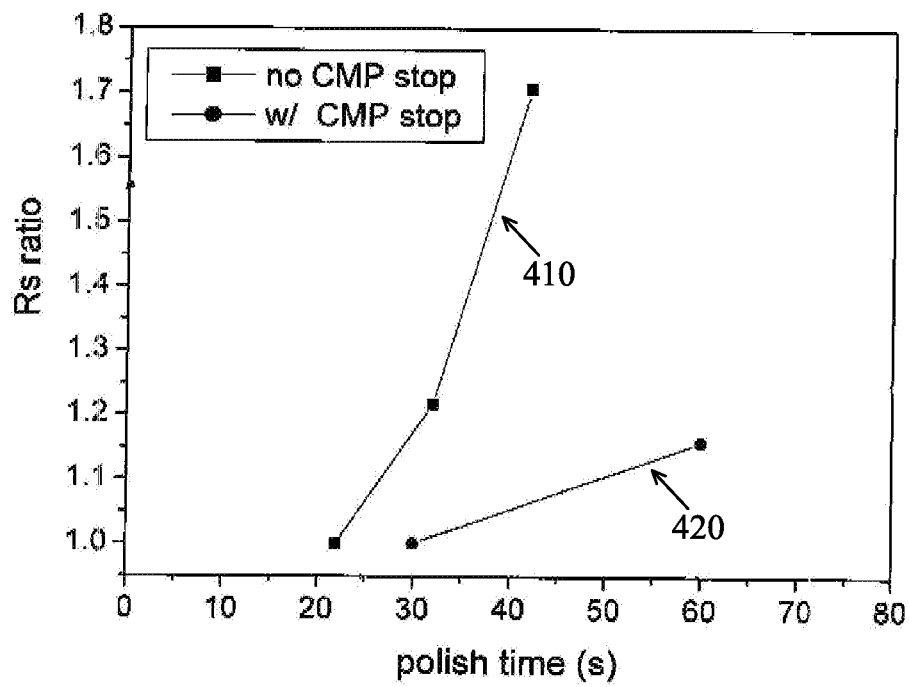
FIG. 4C shows data of Rs (resistivity) ratios as a function of polish time, in accordance with some embodiments.

FIG. 4C shows data of Rs (resistivity) ratios as a function of polish time, in accordance with some embodiments. The Rs ratio is defined as a ratio between an Rs datum of a certain CMP time over an Rs datum at a reference polish time. FIG. 4C shows 2 curves, 410 and 420. The data of curve 410 are Rs ratios of damascene structure shown in FIG. 1A, which does not use a CMP stop layer. The Rs of polish time of about 22 seconds, which is the time it takes to remove most of the copper on the surface of the substrate (outside damascene structure), is used a reference in calculating the Rs ratios. In contrast, data of curve 420 are collected on damascene structures shown in FIG. 3A, which use a dense low-k dielectric layer as a CMP stop layer. The Rs of polish time of about 30 seconds, which is the time it takes to remove most of the copper on the surface of the substrate, is used a reference in calculating the Rs ratios. The data of curve 410 show that by over polishing for about 20 seconds, there is an increase of Rs ratio to 1.7 (or 70% increase of Rs). In contrast, an over polishing of 20 seconds (polish time 50 seconds) for curve 420 only results in an increase of Rs ratio to 1.1 (or 10% increase in Rs). The results show that the low-k CMP stop layer is very effective in protecting the structure against over-polishing.

Figure 4D:
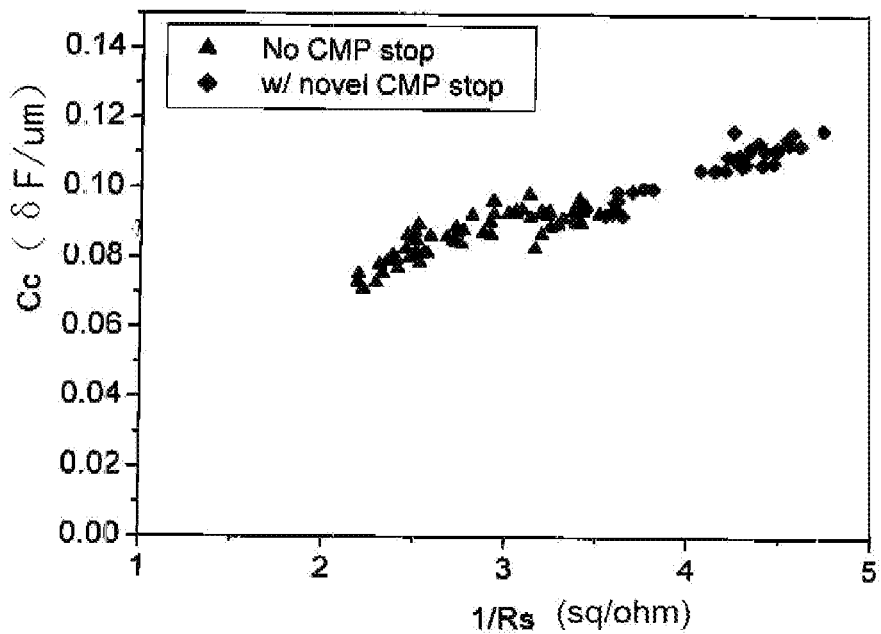
FIG. 4D shows line-to-line capacitance (Cc) data versus Rs, in accordance with some embodiments.

FIG. 4D shows line-to-line capacitance (Cc) data versus 1/Rs, in accordance with some embodiments. 1/Rs correlates to thickness of the damascene structure(s). The data in FIG. 4D show that the Cc data of damascene structures without a CMP stop layer (data in triangles) are distributed to lower 1/Rs (or a thinner stack), in comparison to Cc data of damascene structure using a low-k CMP stop layer described above. Data are collected on wafers after CMP and after bake (for the wafer without CMP stop layer) or after UV curing (for the wafer with the CMP stop layer). The data show that by using a CMP stop layer, the Rs of the damascene structures are lower (with higher 1/Rs). In addition, the Cc (line-to-line capacitance) data for both schemes are linear, which indicates that the usage of the CMP stop layer does not change the characteristics of the damascene structures.

Figure 5:
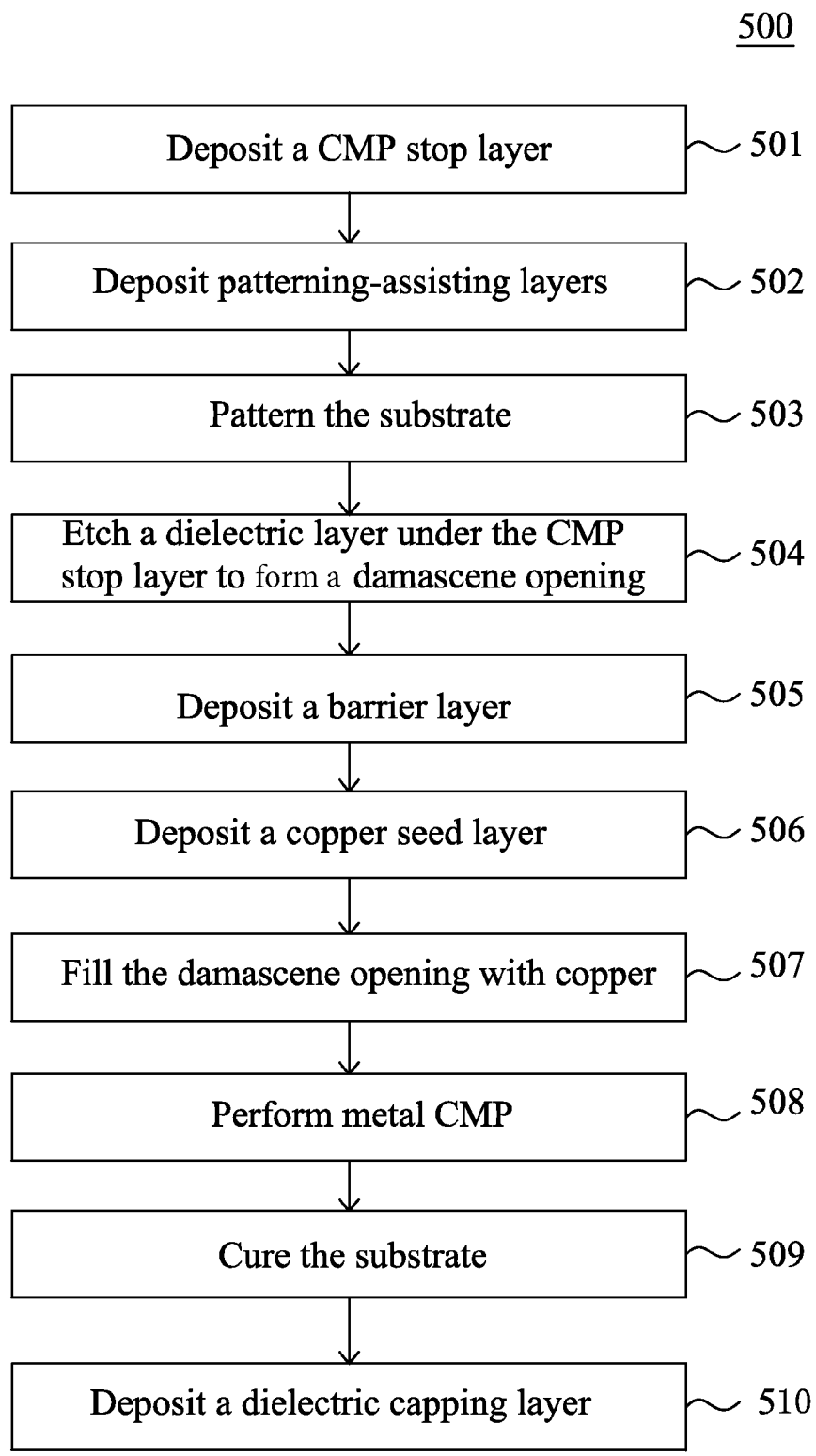
FIG. 5 shows a process flow of forming a damascene structure, in accordance with some embodiments.

FIG. 5 shows a process flow 500 of forming a damascene structure, in accordance with some embodiments. At operation 501, a low-k CMP stop layer is deposited on a substrate with a low-k dielectric layer on top. The low-k CMP stop layer is made of a low-k dielectric film, which includes a porogen and has not been cured, as described above. The substrate could already have other films and patterns, such as device structures, and interconnect and dielectric layers. After the low-k CMP stop layer is deposited, one or more patterning-assisting layer is deposited over the low-k CMP stop layer at operation 502. For example, an ARL (or ARC) and a hard mask layer are deposited on the low-k CMP stop layer. In some embodiments, a buffer layer is deposited between the ARL and the low-k CMP stop layer. Afterwards at operation 503, the hard mask layer is patterned by using lithography and etched to create the pattern. The substrate is then etched at operation 504 by using the hard mask layer as an etch mask. If the damascene is a dual damascene structure, the depth of the dielectric layer etched is about "D," as shown in FIGS. 1A, 2A, and 3A. If the damascene structure is a metal structure or a contact/via structure, the dielectric layer is etched until an underlying conductive layer, such as a gate structure, a doped region, or a metal structure, is reached.

After the opening is created, a barrier layer is deposited at operation 505. The deposition of the barrier layer may also include a deposition of a copper seed layer at operation 506. Following operation 506, a copper layer is plated to coat the opening and the substrate surface at operation 507. A copper CMP and a barrier CMP are then performed to remove the copper outside the damascene opening at operation 508. The metal CMP, which removes both the copper and the barrier layers, is performed until the polish head reaches the CMP stop layer and all metallic materials (including copper and barrier layer) outside the damascene opening are removed. After metal CMP is completed, the substrate is cured to drive out residual molecules and to convert the porogen at operation 509. As mentioned above, there are a number of ways to perform the cure. After curing (or cure) is completed, a pre-heating and/or pretreatment is also performed at operation 509 to drive out the remaining moisture in the CMP etch stop layer. Afterwards, at operation 510 an etching stop layer is deposited on the substrate to prevent the CMP stop layer and copper from contacting oxygen and/or moisture in the air, and also other impurities.

The damascene structures described above are all dual-damascenes. Alternatively, the scheme (or mechanism) described may also be used for single damascene structures. In addition, the dielectric layer 103 does not need to be made of the same low-k material as the CMP stop layer 311, described in FIGS. 3A-3D. The dielectric layer 103 may be any type of low-k material, porous or not. The uncured dense low-k dielectric material described above may be used as a CMP stop layer to protect any type of low-k dielectric material underneath. The dielectric low-k CMP stop layer described above may also be used as a CMP stop layer for CMP of dielectric materials. For example, if a dielectric CMP needs to be performed on a porous low-k dielectric layer, the dense low-k material described above may also be used as a CMP stop layer.

The embodiments of methods and structures disclosed herein provide mechanisms of performing metal CMP without significant loss of copper and a dielectric film of damascene structures. The mechanisms use a metal CMP stop layer made of a low-k dielectric film with a porogen, which significantly reduces the removal rate of the metal CMP stop layer by metal CMP. The metal CMP stop layer is converted into a porous low-k dielectric film after a cure (or curing) to remove or convert the porogen. The low-k value, such as equal to or less than about 2.6, of the metal CMP stop layer makes the impact of using of the metal CMP stop layer on RC delay from minimum to none. Further the CMP stop layer protects the porous low-k dielectric film underneath from exposing to water, organic compounds, and mobile ions in the slurry.

In some embodiments, a damascene structure with a metal chemical-mechanical polishing (CMP) stop layer made of a low dielectric constant (low-k) material is provided. The damascene structure includes a damascene structure for interconnect, and the damascene structure is lined with a barrier layer and is filled with copper. The damascene structure also includes a dielectric layer surrounding the damascene structure, and the dielectric layer is a low-k dielectric material. The damascene structure further includes a metal CMP stop layer over the dielectric layer. The metal CMP stop layer also surrounds the damascene structure, and the metal CMP stop layer is made of a dense (non-porous) low-k dielectric material.

In some other embodiments, a method of forming a damascene structure on a substrate is provided. The method includes depositing a metal CMP stop layer on the substrate having a dielectric layer on a surface of the substrate, and the metal CMP stop layer is a low-k dielectric with a porogen. The method also includes patterning the substrate to form a damascene opening by etching the dielectric layer, and lining the damascene opening with a copper barrier layer. The method further includes filling the damascene opening with a copper layer, and the copper layer is deposited cover the copper barrier layer. In addition, the method includes performing metal CMP to remove the copper layer and the copper barrier layer outside the damascene opening, and the metal CMP stop layer prevents metal CMP from removing the dielectric layer. Additionally, the method includes performing a cure on the metal CMP stop layer; wherein the cure is performed to drive out or convert the porogen in the metal CMP stop layer.

In some other embodiments, a method of forming a damascene structure on a substrate is provided. The method includes depositing a metal CMP stop layer on the substrate having a dielectric layer on a surface of the substrate, and the metal CMP stop layer is a low-k dielectric with a porogen. The method also includes patterning the substrate to form a damascene opening by etching the dielectric layer, and lining the damascene opening with a copper barrier layer. The method further includes filling the damascene opening with a copper layer, and the copper layer is deposited cover the copper barrier layer. In addition, the method includes performing metal CMP to remove the copper layer and the copper barrier layer outside the damascene opening, and the metal CMP stop layer prevents metal CMP from removing the dielectric layer. Additionally, the method includes performing a cure on the metal CMP stop layer; and the cure is performed to drive out or convert the porogen in the metal CMP stop layer. The metal CMP stop layer is an extreme low-k dielectric (ELK) or an ultra low-k dielectric (XLK) with a k values equal to or less than about 2.6 after it is cured.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a damascene structure on a substrate, comprising:
    depositing a metal chemical-mechanical polish (CMP) stop layer on the substrate having a dielectric layer on a surface of the substrate, the dielectric layer having a first dielectric constant value, wherein the metal CMP stop layer is a low-k dielectric with a porogen;
    patterning the substrate to form a damascene opening by etching the dielectric layer;
    lining the damascene opening with a copper barrier layer;
    filling the damascene opening with a copper layer, wherein the copper layer is deposited covering the copper barrier layer;
    performing metal CMP to remove the copper layer and the copper barrier layer outside the damascene opening, wherein the metal CMP stop layer prevents the metal CMP from removing the dielectric layer, and the metal CMP stop layer is uncured; and
    performing a cure on the metal CMP stop layer to convert or drive out the porogen after performing the metal CMP, wherein the curing is performed in a hydrogen-containing environment, wherein a dielectric constant value of the cured metal CMP stop layer is equal to the first dielectric constant value.

2. The method of claim 1, further comprising depositing a dielectric capping layer over a portion of a top surface of the metal CMP stop layer and a top surface of the copper layer in the damascene structure, wherein the dielectric capping layer protects the metal CMP stop layer and the damascene structure from exposure to air, moisture, and/or other impurities.

3. The method of claim 1, wherein the metal CMP stop layer is an extreme low-k dielectric (ELK) or an ultra low-k dielectric (XLK) with a k value equal to or less than about 2.6 after it is cured.

4. The method of claim 3, wherein usage of the metal CMP stop layer made with a dense low-k film with the k value equal to or less than 2.6 after the cure is performed has a minimal impact the resistivity and resistive-capacitive (RC) delay of the damascene structure formed by the method.

5. The method of claim 1, wherein the porogen is either alpha-terpinene or 2,5-norbornadiene, which assists in creating pores in metal CMP stop layer.

6. The method of claim 1, wherein the dielectric layer is made of a dense extreme low-k dielectric (ELK) with a k value equal to or less than about 2.6.

7. The method of claim 1, wherein the dielectric layer is made of a porous ultra low-k dielectric (XLK) with a k value equal to or less than about 2.36.

8. The method of claim 1, wherein a thickness of the metal CMP stop layer is in a range from about 100 Å to about 600 Å.

9. The method of claim 1, wherein the cure performed is an UV curing at a temperature in a range from about 300° C. to about 400° C. and in a duration in a range from about 1 second to about 20 minutes.

10. The method of claim 1, wherein the porogen in the metal CMP stop layer reduces a first removal rate of metal CMP on the metal CMP stop layer to be lower than a second removal rate of metal CMP on the dielectric layer.

11. The method of claim 1, wherein the cure is performed by furnace cure, UV cure, rapid thermal cure, flash cure, or laser cure.

12. A method of forming a damascene structure on a substrate, comprising:
depositing a metal chemical-mechanical polishing (CMP) stop layer on the substrate having a dielectric layer on a surface of the substrate, the dielectric layer having a first k-value, wherein the metal CMP stop layer is a low-k dielectric with a porogen;
patterning the substrate to form a damascene opening by etching the dielectric layer;
lining the damascene opening with a copper barrier layer;
filling the damascene opening with a copper layer, wherein the copper layer is deposited covering the copper barrier layer;
performing metal CMP to remove the copper layer and the copper barrier layer outside the damascene opening, wherein the metal CMP stop layer prevents the metal CMP from removing the dielectric layer, and the metal CMP stop layer is uncured;
performing a cure on the metal CMP stop layer in a hydrogen-containing environment after performing the metal CMP, wherein the cure is performed to drive out or convert the porogen in the metal CMP stop layer, wherein the metal CMP stop layer has a k-value equal to the first k-value after the metal CMP stop layer is cured.

13. The method of claim 12, wherein the dielectric layer is made of a dense extreme low-k dielectric (ELK) with a k value equal to or less than about 2.6.

14. A method of forming a damascene structure on a substrate, the method comprising:
forming a low-k dielectric layer over the substrate;
forming a chemical mechanical polishing (CMP) stop layer over the low-k dielectric layer, the CMP stop layer comprising a dense low-k dielectric material, the CMP stop layer further comprising a porogen;
forming at least one damascene opening in the low-k dielectric layer;
filling the at least one damascene opening with a metal material;
performing a metal CMP process;
stopping the metal CMP process at the CMP stop layer, wherein the CMP stop layer is uncured; and
curing the CMP stop layer to remove or convert the porogen after stopping the metal CMP process, wherein the curing is performed in a hydrogen-containing environment having sufficient hydrogen to prevent oxidation of the metal material, and the cured CMP stop layer has a k-value equal to a k-value of the low-k dielectric layer.

15. The method of claim 14, wherein the dense low-k dielectric material is different than the low-k dielectric layer.

16. The method of claim 14, further comprising forming a dielectric capping layer over the metal material and the cured CMP stop layer.

17. The method of claim 14, wherein the forming the low-k dielectric layer comprises adding additives to the low-k dielectric layer.

18. The method of claim 17, wherein the adding the additives comprises increasing a carbon content of the low-k dielectric layer.

19. The method of claim 17, wherein the adding the additives comprises increasing at least one of a mechanical strength or a hardness of the low-k dielectric layer.

20. The method of claim 14, wherein the curing the CMP stop layer comprises converting a material of the CMP stop layer to a same material as the low-k dielectric layer.

* * * * *